(12) United States Patent
Zhu et al.

(10) Patent No.: US 8,996,948 B2
(45) Date of Patent: *Mar. 31, 2015

(54) METHODS, SYSTEMS, AND APPARATUS FOR TAIL TERMINATION OF TURBO DECODING

(75) Inventors: Jianbin Zhu, Poway, CA (US); Yuan Li, San Diego, CA (US); Tao Zhang, San Diego, CA (US)

(73) Assignee: Intel Corporation, Santa Clara, CA (US)

( * ) Notice: Subject to any disclaimer, the term of this patent is extended or adjusted under 35 U.S.C. 154(b) by 89 days.

This patent is subject to a terminal disclaimer.

(21) Appl. No.: 13/608,905

(22) Filed: Sep. 10, 2012

(65) Prior Publication Data

US 2013/0007555 A1    Jan. 3, 2013

Related U.S. Application Data

(63) Continuation-in-part of application No. 12/975,343, filed on Dec. 21, 2010.

(60) Provisional application No. 61/289,921, filed on Dec. 23, 2009, provisional application No. 61/289,958, filed on Dec. 23, 2009, provisional application No. 61/292,801, filed on Jan. 6, 2010, provisional application No. 61/301,046, filed on Feb. 3, 2010.

(51) Int. Cl.
*H03M 13/00* (2006.01)
*H04L 1/00* (2006.01)
*H03M 13/15* (2006.01)
*H03M 13/29* (2006.01)

(52) U.S. Cl.
CPC .......... *H04L 1/005* (2013.01); *H03M 13/1515* (2013.01); *H03M 13/2957* (2013.01); *H03M 13/29* (2013.01); *H04L 1/006* (2013.01)
USPC ........................................ 714/752; 714/795

(58) Field of Classification Search
CPC .................................................. H03M 13/2957
USPC .................................. 714/755, 786, 794–796
See application file for complete search history.

(56) References Cited

U.S. PATENT DOCUMENTS

| | | | |
|---|---|---|---|
| 6,594,792 B1 | 7/2003 | Hladik et al. | |
| 6,718,504 B1* | 4/2004 | Coombs et al. | 714/755 |
| 6,993,704 B2* | 1/2006 | Wolf | 714/794 |
| 7,185,260 B2* | 2/2007 | Coombs et al. | 714/755 |
| 7,200,799 B2* | 4/2007 | Wang et al. | 714/795 |
| 7,849,377 B2 | 12/2010 | Hekstra et al. | |
| 8,250,448 B1 | 8/2012 | Andrews | |
| 2007/0061666 A1 | 3/2007 | Nakai | |
| 2007/0101231 A1 | 5/2007 | Kutz et al. | |

(Continued)

OTHER PUBLICATIONS

Kim et al., IEEE Transactions on Circuits and Systems "Double-Binary Circular Turbo Decoding Based on Border Metric Encoding", vol. 55, No. 1, Jan. 2008, pp. 79-83.

*Primary Examiner* — Esaw Abraham

(57) ABSTRACT

Methods and apparatus for tail termination are provided that include a decoder that includes a processor configured to a forward state metric and a backward state metric wherein each iteration of an initial state of the backward state metric is fetched from a memory and is pre-computed without feedback from a decoding iteration. Each decoding iteration is substantially identical, and the backward state metric that is pre-computed is used for a subsequent iteration. The decoder may include a turbo decoder or a radix-4 decoder.

15 Claims, 2 Drawing Sheets

(56) References Cited

U.S. PATENT DOCUMENTS

| | | |
|---|---|---|
| 2007/0234180 A1 | 10/2007 | Edmonston et al. |
| 2008/0092010 A1 | 4/2008 | Orio |
| 2008/0270868 A1* | 10/2008 | Shinagawa et al. ........... 714/752 |
| 2009/0300463 A1* | 12/2009 | Purkovic et al. .............. 714/755 |
| 2011/0107019 A1* | 5/2011 | Pan et al. ...................... 711/104 |
| 2013/0156133 A1 | 6/2013 | Gentile et al. |

* cited by examiner

METHODS, SYSTEMS, AND APPARATUS FOR TAIL TERMINATION OF TURBO DECODING

This patent application is a continuation-in-part of patent application Ser. No. 12/975,343 filed on Dec. 21, 2010, entitled "Methods and Apparatus for Tail Termination of Turbo Decoding," which in turn claims priority from patent applications U.S. Provisional Application Ser. No. 61/289,921 entitled "A Method of Trellis Termination Handling in Turbo Decoder," which was filed on Dec. 23, 2009; U.S. Provisional Application Ser. No. 61/289,958 entitled "A Simple and Efficient Early Stop Scheme for Turbo Decoder" which was filed on Dec. 23, 2009; U.S. Provisional Application Ser. No. 61/292,801 entitled "A UMTS Turbo Decoder with Multiple MAP Engines" which was filed on Jan. 6, 2010; and U.S. Provisional Application Ser. No. 61/301,046 entitled "A Contention Free Memory Structure and Interleaver for Parallel HSPA LTE Turbo Decoder" which was filed on Feb. 3, 2010. Each of U.S. patent application Ser. Nos. 12/975,343, 61/289,958, 61/292,801, 61/289,921 and 61/301,046 is hereby incorporated by reference in its entirety.

BACKGROUND OF THE INVENTION

1. Field of the Invention

This disclosure relates generally to receivers for communication systems, and, more particularly, to methods and apparatus to perform turbo decoding for communications receivers.

2. Background

Wireless communication systems include a network infrastructure having base stations throughout a coverage area, each of which is dedicated to a cell or cell site. The base stations are controlled by base station controllers that further communicate with a mobile switching center.

The wireless networks operate according to a number of standards including Code Division Multiple Access (CDMA) standards and the Universal Mobile Telecommunications Services (UMTS) including the Wideband CDMA (WCDMA) and Long Term Evolution (LTE) standards. These standards support high throughput for both voice and data.

Turbo coding is employed in wireless systems to improve performance in which data is split into blocks and coded by a turbo encoder. The decoding may be conducted iteratively and each iteration of the decoder may improve the reliability of the information bits. In order to reach a sufficient decoding performance, a fixed number of iterations may be employed. In many cases, the correct decoding results may be generated with only a few iterations.

Turbo codes used for UMTS standards, use identical constituent recursive convolutional codes with different interleaver designs. A tail sequence of 12 bits may be employed to terminate the trellis to enforce the state to zero state.

The BCIR algorithm described in L. Bahl, J. Cocke, F. Jelinek, and J. Raviv, "Optimal Decoding of Linear Codes for minimizing symbol error rate," *IEEE Transactions on Information Theory*, Vol. IT-20(2), pp. 284-287, March 1974, which is based on maximum a posteriori (MAP) decoding, needs to compute a forward state metric calculation and backward state metric calculation. Multiple iterations of MAP decoding are performed to gradually improve the decoding reliability.

Moreover, conventional turbo decoder design treat tails bit identically as information and parity bits in order to compute the backward state metrics. For UMTS standards, turbo codes employ the 6 tails bits for each constituent decoder are treated as 3 additional trellis stages for decoding. For each iteration, the state metric initial stage computation is repeated because no additional information is provided. This leads to complexity especially for LTE turbo codes, where the block size may be applied and defined as a multiple of two and radix-4 turbo decoding.

In radix-4 decoding, each decoding stage generates two stages of extrinsic information and processes two trellis stages as compared to one for normal radix-2 decoding. Since the number of stages for trellis termination is three, special handling is required for a backward metric calculation, since the number of stages of trellis termination is not divisible by two.

SUMMARY

The various embodiments provided herein are generally directed to a method, system, and/or device for providing tail termination include a decoder configured to a forward state metric and a backward state metric, wherein each iteration of an initial state of the backward state metric is fetched from a memory and is pre-computed without feedback from a decoding iteration. Each decoding iteration is substantially identical, and the backward state metric that is pre-computed is used for a subsequent iteration. The decoder may include a normal radix-2 turbo decoder or a radix-4 decoder.

In one aspect, there is described a method for tail termination that includes calculating a forward state metric; calculating a backward state metric, wherein each iteration of an the initial state of the backward state metric is fetched from a memory and is pre-computed without feedback from a decoding iteration.

In another aspect, there is disclosed a system including a memory and a decoder coupled to the memory. The decoder may include a processor configured to calculate a forward state metric and a backward state metric wherein each iteration of an initial state of the backward state metric is fetched from a memory and is pre-computed without feedback from a decoding iteration.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

DETAILED DESCRIPTION

Each of the additional features and teachings disclosed below can be utilized separately or in conjunction with other features and teachings to provide a device, system, and/or method for providing trellis termination in a turbo decoder. Representative examples of the present invention, which utilize many of these additional features and teachings both separately and in combination, will now be described in further detail with reference to the attached drawings. This detailed description is merely intended to teach a person of skill in the art further details for practicing preferred aspects of the present teachings and is not intended to limit the scope of the invention. Therefore, combinations of features and steps disclosed in the following detail description may not be necessary to practice the invention in the broadest sense, and are instead taught merely to particularly describe representative examples of the present teachings Moreover, the various features of the representative examples and the dependent claims may be combined in ways that are not specifically and explicitly enumerated in order to provide additional useful embodiments of the present teachings. In addition, it is expressly noted that all features disclosed in the description and/or the claims are intended to be disclosed separately and independently from each other for the purpose of original disclosure, as well as for the purpose of restricting the claimed subject matter independent of the compositions of the features in the embodiments and/or the claims. It is also expressly noted that all value ranges or indications of groups of entities disclose every possible intermediate value or intermediate entity for the purpose of original disclosure, as well as for the purpose of restricting the claimed subject matter.

Methods and apparatus for tail termination are provided that include a decoder that includes a processor configured to a forward state metric and a backward state metric wherein each iteration of an initial state of the backward state metric is fetched from a memory and is pre-computed without feedback from a decoding iteration. Each decoding iteration is substantially identical, and the backward state metric that is pre-computed is used for a subsequent iteration. The decoder may include a turbo decoder or a radix-4 decoder.

Figure 1:
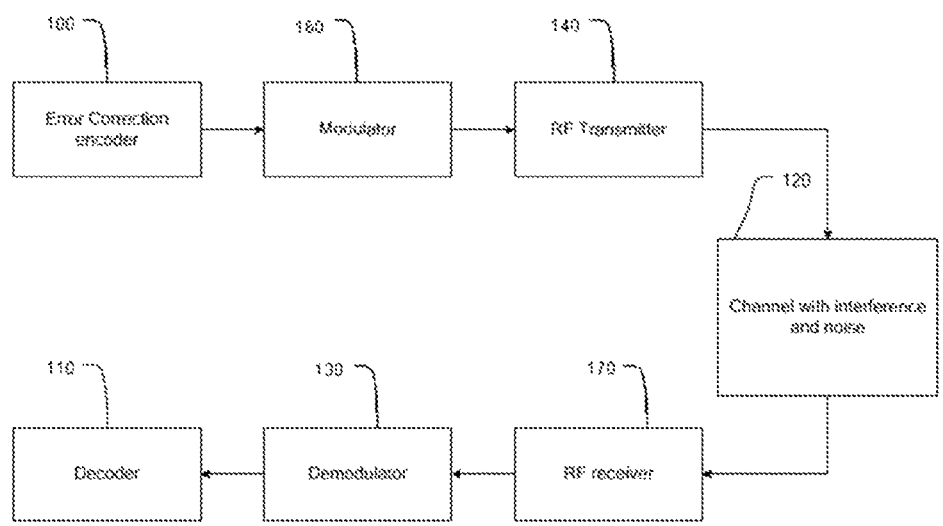
FIG. 1 is a communications system with error correction coding in an embodiment.

FIG. 1 illustrates a digital communication system including an error correction encoder 100 according to one embodiment for correcting errors in a received vector or data with an iterative decoder 110. Error-correcting codes of encoder 100 and decoding codes of decoder 110 are used to send messages over a channel.

The message may be encoded using an encoded algorithm and also modulated and channel coded by a modulator 160. The message may then be transmitted by a transmitter 140 and subject to SNR as it is transmitted over the channel 120.

The message may arrive at the decoder 110 through a receiver 170 and a demodulator 130 as shown. It should be noted that any one of the interface to the encoder, the encoder, modulator, and/or transmitter may be may be formed on a single Integrated Circuit (IC). Any one of the demodulator, receiver, the decoder, and/or the interface to the decoder may be formed on a single Integrated Circuit (IC). The demodulator may demodulate the message into a sequence of discrete data symbols that is aligned with a codeword that was likely sent. The decoder 140 may use a decoding algorithm based on a decoding code based on the encoding code to decode the received codeword. This is repeated until a level of error correction is achieved.

Figure 2:
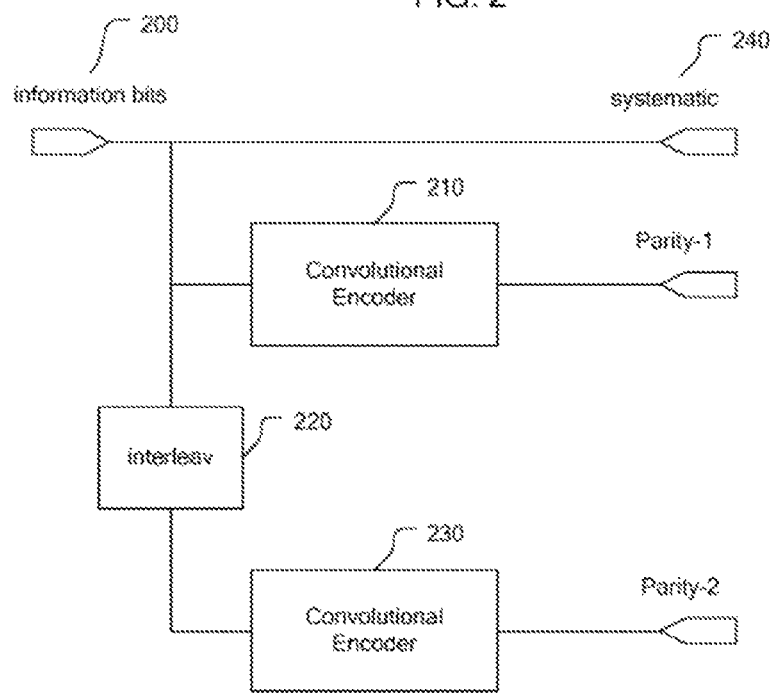
FIG. 2 is a block diagram of a turbo coder in an embodiment.

FIG. 2 illustrates an example of a turbo encoder that includes two convolutional encoders 210 and 230. Each convolutional encoder may add parity data, e.g., parity-1, parity-2. The turbo encoder may have as an input information bits 200 and systematic data 240, which is representative of the original data, such as a copy the information bits 200. The error correcting data or parity data and any other data may be interleaved at 220.

The resultant parity bits of the first encoder 210, the second encoder 230 and the systematic information bits 240 are transmitted over communications channels.

Figure 3:
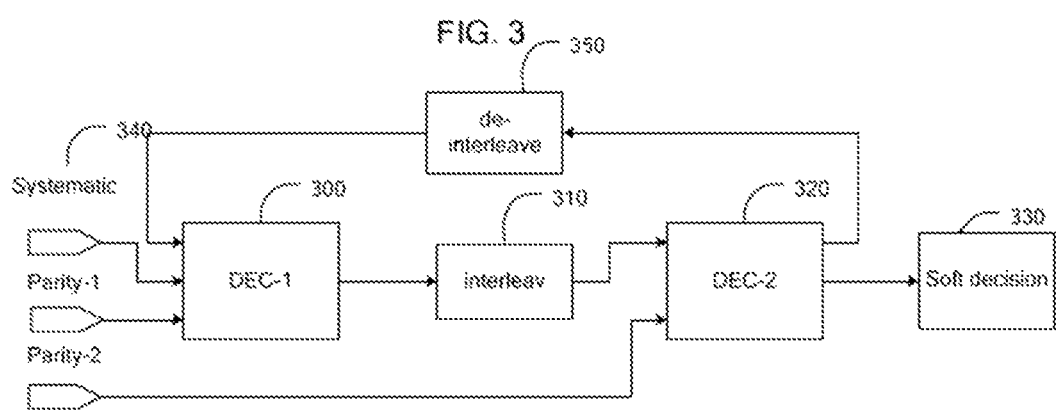
FIG. 3 a block diagram of an example iterative decoding system.

A block diagram of an example iterative decoding system is illustrated in FIG. 3. In a decoding iteration, two soft-input, soft-output (SISO) decoders may be employed. The output of the first decoder 300 may be fed into a second decoder as an input after interleaving. Similarly, the output of the second decoder 320 may be fed into the first decoder as an input.

A decoding iteration may be completed by passing information once between the DEC-1 300 to DEC-2 320 and DEC-2 320 to interleaver 310. For each decoder, MAP decoding algorithms, which generate a maximum a posterior (MAP) probability of the information bits, may be used. The decoder 300, such as a MAP decoder, may accept as soft inputs, systematic bits 340 and parity bits Parity-1 and Parity-2. The output of the decoder 320 may be fed to an de-interleaver 350. The MAP decoder may compute the soft-output decision 330 of the systematic bits using the trellis structure of the convolutional code. The soft-output may be referred to as a posterior information.

The extrinsic information may be calculated substantially concurrently and referred to as the contribution of information from the current decoding process. The extrinsic information may be de-interleaved before passing to the next decoding stage.

In the next decoding stage, the extrinsic information may be utilized as a priori information of the systematic bits and added together with the systematic information bits before decoding. This type of iteration may be repeated multiple times before the final results are given as the output. The number of iterations may depend on the SNR of the channel. For low SNR ranges, more iteration, e.g., 8 to 16, may be required. For high SNR ranges, the number of iterations may be largely reduced.

In one embodiment, a method to pre-compute the initial values of backward state metric is described. These metrics may be substantially identical from one iteration to the next. In one embodiment, pre-computation may be performed. The values of the pre-computation may be stored for further use in a subsequent iteration. The initial values may be computed from the input signal. In one example of UMTS turbo decoding, eight initial values referred as beta values may be calculated as follows:

$$\begin{cases} \beta_{k+0}(0) = \gamma^{00}_{k+3} + \gamma^{00}_{k+2} + \gamma^{00}_{k+1} \\ \beta_{k+0}(1) = \gamma^{00}_{k+3} + \gamma^{00}_{k+2} + \gamma^{11}_{k+1} \\ \beta_{k+0}(2) = \gamma^{00}_{k+3} + \gamma^{11}_{k+2} + \gamma^{10}_{k+1} \\ \beta_{k+0}(3) = \gamma^{00}_{k+3} + \gamma^{11}_{k+2} + \gamma^{01}_{k+1} \\ \beta_{k+0}(4) = \gamma^{11}_{k+3} + \gamma^{10}_{k+2} + \gamma^{01}_{k+1} \\ \beta_{k+0}(5) = \gamma^{11}_{k+3} + \gamma^{10}_{k+2} + \gamma^{10}_{k+1} \\ \beta_{k+0}(6) = \gamma^{11}_{k+3} + \gamma^{01}_{k+2} + \gamma^{11}_{k+1} \\ \beta_{k+0}(7) = \gamma^{11}_{k+3} + \gamma^{01}_{k+2} + \gamma^{00}_{k+1} \end{cases} \quad \text{Equation 1}$$

Where $\beta_k(s)$ is the backward state metric for state s of the k-th bit in logarithm domain and $\gamma_k^{uv}$ is the branch metric associated with the state transition that produces systematic bit u and parity bit v in logarithm domain.

In another example for LTE turbo decoding using a radix-4 decoder, the code block size may be a multiple of two. Accordingly, no additional boundary consideration may be required to calculate the three trellis termination stages. The backward state metrics may be directly initialized from the stored values which are pre-computed.

It is also noted that the encoders and decoders as well as any other processing module described herein may be formed or implemented in several ways. In one embodiment, the encoders and/or decoders or processing modules may be implemented as circuitry. In another embodiment, the embodiment the encoders and/or decoders or processing modules may be configured as software in a digital signal processor (DSP) or similar type device. In yet another embodiment, the encoders and/or decoders or processing modules may be implemented as a combination of software and hardware In other embodiments, the encoders and/or decoders or processing modules may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The encoders and/or decoders or processing modules may be coupled to a memory 240 that is operable to store operational instructions that enable to encoders and/or decoders or processing modules to perform their function.

Such a memory may be a single memory device or a plurality of memory devices. Such a memory may be a read-only memory, random access memory, volatile memory, non-volatile memory, static memory, dynamic memory, flash memory, and/or any device that stores digital information. Note that when the encoders and/or decoders or processing modules implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

The present invention or any part(s) or function(s) thereof, may be implemented using hardware, software, or a combination thereof, and may be implemented in one or more computer systems or other processing systems. A computer system for performing the operations of the present invention and capable of carrying out the functionality described herein can include one or more processors connected to a communications infrastructure (e.g., a communications bus, a cross-over bar, or a network). Various software embodiments are described in terms of such an exemplary computer system. After reading this description, it will become apparent to a person skilled in the relevant art(s) how to implement the invention using other computer systems and/or architectures.

The foregoing description of the preferred embodiments of the present invention has been presented for purposes of illustration and description. It is not intended to be exhaustive or to limit the invention to the precise form or to exemplary embodiments disclosed. Obviously, many modifications and variations will be apparent to practitioners skilled in this art. Similarly, any process steps described might be interchangeable with other steps in order to achieve the same result. The embodiment was chosen and described in order to best explain the principles of the invention and its best mode practical application, thereby to enable others skilled in the art to understand the invention for various embodiments and with various modifications as are suited to the particular use or implementation contemplated. It is intended that the scope of the invention be defined by the claims appended hereto and their equivalents. Reference to an element in the singular is not intended to mean "one and only one" unless explicitly so stated, but rather means "one or more." Moreover, no element, component, nor method step in the present disclosure is intended to be dedicated to the public regardless of whether the element, component, or method step explicitly recited in the following claims. No claim element herein is to be construed under the provisions of 35 U.S.C. Sec. 112, sixth paragraph, unless the element is expressly recited using the phrase "means for . . . ."

It should be understood that the figures illustrated in the attachments, which highlight the functionality and advantages of the present invention, are presented for example purposes only. The architecture of the present invention is sufficiently flexible and configurable, such that it may be utilized (and navigated) in ways other than that shown in the accompanying figures.

Furthermore, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way. It is also to be understood that the steps and processes recited in the claims need not be performed in the order presented.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices and/or other machine-readable mediums, processor-readable mediums, and/or computer-readable mediums for storing information. The terms "machine-readable medium", "computer-readable medium", and/or "processor-readable medium" may include, but are not limited to non-transitory mediums such as portable or fixed storage devices, optical storage devices, and various other mediums capable of storing, containing or carrying instruction(s) and/or data. Thus, the various methods described herein may be fully or partially implemented by instructions and/or data that may be stored in a "machine-readable medium", "computer-readable medium", and/or "processor-readable medium" and executed by one or more processors, machines and/or devices.

The various features of the invention described herein can be implemented in different systems without departing from the invention. It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

The invention claimed is:

1. A decoder, comprising:
at least one processor configured to:
calculate backward state initial values from an input signal, and
store the backward state initial values as a pre-computed backward state metric in a memory,
for each of a plurality of decoding iterations, the at least one processor is further configured to calculate a forward state metric and calculate a backward state metric, wherein for each decoding iteration for calculating an initial backward state metric, the processor fetches from the memory, the pre-computed backward state metric.

2. The decoder of claim 1, wherein each decoding iteration for calculating an initial backward state metric is substantially identical.

3. The decoder of claim 1, further comprising a turbo decoder.

4. The decoder of claim 1, further comprising a radix-4 decoder.

5. The decoder of claim 1, wherein at least one iteration further comprises calculating, by the at least one processor, extrinsic information.

6. A method for iteratively decoding by a decoder system comprising at least one processor, the method comprising:
    calculating backward state initial values from an input signal,
    storing the backward state initial values as a pre-computed backward state metric in a memory,
    wherein for each of a plurality decoding iterations the at least one processor is further configured to:
    calculate a forward state metric;
    calculate a backward state metric, wherein for each decoding iteration for calculating an initial backward state metric, the at least one processor fetches the pre-computed backward state metric from the memory.

7. The method of claim 6, wherein each decoding iteration for calculating an initial backward state metric is substantially identical.

8. The method of claim 6, the decoder system comprising a turbo decoder.

9. The method of claim 6, the decoder system comprising a radix-4 decoder.

10. The method of claim 6, wherein at least one of the decoding iterations further comprises calculating, by the at least one processor, extrinsic information.

11. A system, comprising:
    a memory; and
    a decoder system coupled to the memory, the decoder system comprising a processor configured to:
        calculate backward state initial values from an input signal, and
        store the backward state initial values as a pre-computed backward state metric in a memory,
        for each of a plurality decoding iterations calculate a forward state metric and calculate a backward state metric, wherein for each decoding iteration for calculating an initial backward state metric, the processor fetches the pre-computed backward state metric from the memory,
    wherein the same initial state of the backward state metric is pre-computed independent of a decoding iteration.

12. The system of claim 11, wherein each decoding iteration for calculating an initial backward state metric is substantially identical.

13. The system of claim 11, wherein the decoder system comprises a turbo decoder.

14. The system of claim 11, wherein the decoder system comprises a radix-4 decoder.

15. The system of claim 11, wherein at least one of the decoding iterations comprises calculating, by the at least one processor, extrinsic information.

* * * * *